(12) United States Patent
Robin et al.

(10) Patent No.: US 9,428,717 B2
(45) Date of Patent: Aug. 30, 2016

(54) COMPOSITIONS OF METHYL PERFLUOROHEPTENE ETHERS, 1,1,1,2,2,3,4,5,5,5-DECAFLUOROPENTANE AND TRANS-1,2-DICHLOROETHYLENE AND USES THEREOF

(71) Applicant: THE CHEMOURS COMPANY, FC, LLC, Wilmington, DE (US)

(72) Inventors: Mark L. Robin, Middletown, DE (US); Hideaki Kikuchi, Shizuoka (JP)

(73) Assignee: THE CHEMOURS COMPANY FC, LLC, Wilmington, DE (US)

( * ) Notice: Subject to any disclaimer, the term of this patent is extended or adjusted under 35 U.S.C. 154(b) by 0 days.

(21) Appl. No.: 14/707,116

(22) Filed: May 8, 2015

(65) Prior Publication Data

US 2015/0329806 A1 Nov. 19, 2015

Related U.S. Application Data

(60) Provisional application No. 61/992,267, filed on May 13, 2014.

(51) Int. Cl.
| | |
|---|---|
| *C11D 7/50* | (2006.01) |
| *C11D 3/43* | (2006.01) |
| *C11D 3/24* | (2006.01) |
| *C23G 5/028* | (2006.01) |
| *G03F 7/42* | (2006.01) |

(52) U.S. Cl.
CPC ............ *C11D 7/5063* (2013.01); *C11D 3/245* (2013.01); *C11D 3/43* (2013.01); *C23G 5/02806* (2013.01); *G03F 7/426* (2013.01)

(58) Field of Classification Search
CPC .... C11D 11/0047; C11D 7/5018; C11D 3/43
See application file for complete search history.

(56) References Cited

U.S. PATENT DOCUMENTS

| | | | |
|---|---|---|---|
| 3,085,918 A | 4/1963 | Sherliker et al. | |
| 5,196,137 A | 3/1993 | Merchant | |
| 5,759,986 A * | 6/1998 | Merchant | C08J 9/149 134/10 |
| 5,908,822 A * | 6/1999 | Dishart | C07F 9/091 134/2 |
| 6,852,684 B1 * | 2/2005 | Westbrook | C09K 3/30 510/407 |
| 8,399,713 B2 | 3/2013 | Bartelt et al. | |
| 8,410,039 B2 * | 4/2013 | Bartelt | C11D 7/5063 134/38 |

* cited by examiner

*Primary Examiner* — Gregory Webb

(57) ABSTRACT

Disclosed are compositions comprising 90 to 99 weight percent trans-1,2-dichloroethylene, from 0.1 to 8 weight percent methylperfluoroheptene ethers and from 0.1 to 2.0 weight percent of 1,1,1,2,2,3,4,5,5,5-decafluoropentane, wherein the composition is non-flammable. The disclosure further provides a method for removing residue from a surface of an article comprising: (a) contacting the article with a composition comprising a composition of MPHE, HFC-4310mee and trans-1,2-dichloroethylene; and (b) recovering the surface from the composition.

19 Claims, No Drawings

COMPOSITIONS OF METHYL PERFLUOROHEPTENE ETHERS, 1,1,1,2,2,3,4,5,5,5-DECAFLUOROPENTANE AND TRANS-1,2-DICHLOROETHYLENE AND USES THEREOF

BACKGROUND INFORMATION

1. Field of the Disclosure

The present disclosure is in the field of methyl perfluoroheptene ether compositions. These compositions are zero ODP, low GWP compositions and are useful in precision cleaning applications as a defluxing agent and for removing oils or residues from a surface.

2. Description of the Related Art

Precision cleaning is required throughout a broad range of modern industries. Industries as diverse as printed circuit board manufacturing and watchmaking require cleaning to stringent standards to ensure the final product provides reliable and trouble-free performance. A vast array of industries, including the aerospace, transportation, telecommunications and data processing industries all employ critical electronics and circuit boards whose failure can be catastrophic. The printed circuit boards (PCBs) employed in these systems must be cleaned with a solvent prior to their use to remove flux and other soils introduced during the PCB manufacturing process. Products used in the semiconductor industry require precision cleaning to meet stringent performance criteria. The aerospace industry requires precision cleaning of landing gear to eliminate fracturing of landing gear parts due to trapped water. The jewelry and watchmaking industries demand an end product that is aesthetically pleasing, spot-free and void of any soils. Medical devices ranging from surgical needles to artificial heart valves must be cleaned to stringent standards to prevent infection and the spread of disease. The automotive industry requires precision cleaning of critical parts such as fuel injectors, ABS brakes, compressors, relays, sensors and switches. Solvents are also required for the spot-free cleaning of optical parts including optical assemblies, lenses, fiber optics and flat-panel displays.

Precision solvents should ideally be nonflammable and have low toxicity to provide safety in use. High solvent effectiveness at removing soils is also desired. Solvent effectiveness is typically expressed as a Kauri Butanol (KB) value, which reflects the ability of the solvent to dissolve heavy hydrocarbon greases—the higher the KB value, the higher the effectiveness of the solvent.

During the early 1970s, the most popular solvent for precision cleaning was trichloroethylene (TCE). Due to environmental issues related to water and ground pollution, however, TCE was replaced in many applications by the fluorine-based solvent CFC-113 beginning in the late 1970s. TCE continues to face increasing regulations, both domestically and abroad, and is also a potential carcinogen. CFC-113, however, is, a solvent which contributes to the destruction of stratospheric ozone and is characterized by a large ozone depletion potential (ODP value). As a result CFC-113 has since been banned due to its ozone depleting properties under the provisions of the 1987 Montreal Protocol. Following the ban of CFC-113, solvents with low, but not zero ODPs were developed, including solvents such as HCFC-141b and HCFC-225. However, these solvents are scheduled for phaseout in the near future due to their ozone depleting characteristics. More recently, zero ODP solvents have been developed, including hydrofluorocarbons (HFCs) and hydrofluoroethers (HFEs). Although these compounds do not contribute to ozone depletion, they are characterized by moderate global warming potentials (GWPs) and are classified as Greenhouse Gases (GHGs), i.e., gases which contribute in some degree to global warming/climate change. Among HFCs which have been found useful for precision solvent applications include 1,1,1,2,3,4,4,5,5,5-decafluoropentane (HFC-43-10mee), known commercially as Vertrel XF. Azeotropic compositions comprising about 58-68 weight percent 1,1,1,2,3,4,4,5,5,5-decafluoropentane (HFC-43-10mee) and about 32-42 weight percent trans-1,2-dichloroethylene are described in U.S. Pat. No. 5,196,137.

Azeotropic compositions comprising from 0.4 to 29 weight percent MPHE and trans-1,2-dichloroethylene are disclosed in U.S. Pat. No. 8,410,039. Compositions comprising 13.5 weight percent MPHE and 86.5 weight percent trans-1,2-dichloroethylene are not sufficiently nonflammable to be used in some solvent cleaning applications. When such compositions are tested for flash point according to ASTM D56-05, they exhibited some flashes when tested in multiple replicates indicating the potential for some flammability under some conditions.

It is obvious there is a need for precision solvents that are not only characterized by low toxicity, and high solvency, but are also characterized by zero ODPs and low GWPs. Even more desirable are solvents that are also nonflammable.

The present disclosure provides zero ODP, low GWP compositions useful in precision cleaning applications such as semiconductor chip and circuit board cleaning, defluxing, and degreasing processes. The present compositions are also characterized by high solvency power and low toxicity.

SUMMARY

The present disclosure provides zero ODP, low GWP compositions comprising (a) from 0.1 to 8 weight percent methyl perfluoroheptene ethers (MPHE), from 0.1 to 2.0 weight percent 1,1,1,2,2,3,4,5,5,5-Decafluoropentane (HFC-43-10mee) and from 90 to 99 weight percent trans-1,2-dichloroethylene, wherein the composition is nonflammable. The present disclosure further provides a method for removing residue from a surface of an article comprising: (a) contacting the article with a composition comprising a composition of MPHE, HFC-4310mee and trans-1,2-dichloroethylene; and (b) recovering the surface from the composition.

DETAILED DESCRIPTION

Described herein are compositions of methylperfluoroheptene ethers (MPHE), trans-1,2-dichloroethylene, and HFC-43-10 mee. MPHE is described in U.S. Pat. No. 8,399,713. Also described herein are novel methods of using compositions comprising MPHE, trans-1,2-dichloroethylene and HFC-43-10mee of the invention. These compositions exhibit excellent cleaning in solvent applications and do not exhibit a flash point when tested according to ASTM D56-05(2010).

Azeotropic compositions comprising from 0.4 to 29 weight percent MPHE and trans-1,2-dichloroethylene are disclosed in U.S. Pat. No. 8,410,039. Compositions comprising 13.5 weight percent MPHE and 86.5 trans-1,2-dichloroethylene are not sufficiently nonflammable to be used in some solvent cleaning applications.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). As used herein, the term "consisting essentially of" is intended to cover compositions which contain the recited material, and other components which do not affect the basic and novel characteristics of the claimed composition.

The transitional phrase "consisting of" excludes any element, step, or ingredient not specified. If in the claim such would close the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" is used to define a composition, method or apparatus that includes materials, steps, features, components, or elements, in addition to those literally disclosed provided that these additional included materials, steps, features, components, or elements do not materially affect the basic and novel characteristic(s) of the claimed invention. The term 'consisting essentially of' occupies a middle ground between "comprising" and 'consisting of'.

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present disclosure, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

Many aspects and embodiments have been described above and are merely exemplary and not limiting. After reading this specification, skilled artisans appreciate that other aspects and embodiments are possible without departing from the scope of the invention.

As used herein, an azeotropic composition is a constant boiling liquid admixture of two or more substances wherein the admixture distills without substantial composition change and behaves as a constant boiling composition. Constant boiling compositions, which are characterized as azeotropic, exhibit either a maximum or a minimum boiling point, as compared with that of the non-azeotropic mixtures of the same substances. Azeotropic compositions include homogeneous azeotropes which are liquid admixtures of two or more substances that behave as a single substance, in that the vapor, produced by partial evaporation or distillation of the liquid, has the same composition as the liquid. Azeotropic compositions, as used herein, also include heterogeneous azeotropes where the liquid phase splits into two or more liquid phases. In these embodiments, at the azeotropic point, the vapor phase is in equilibrium with two liquid phases and all three phases have different compositions. If the two equilibrium liquid phases of a heterogeneous azeotrope are combined and the composition of the overall liquid phase calculated, this would be identical to the composition of the vapor phase.

As used herein, the term "azeotrope-like composition" also sometimes referred to as "near azeotropic composition," means a constant boiling, or substantially constant boiling liquid admixture of two or more substances that behaves as a single substance. One way to characterize an azeotrope-like composition is that the vapor produced by partial evaporation or distillation of the liquid has substantially the same composition as the liquid from which it was evaporated or distilled. That is, the admixture distills or refluxes without substantial composition change. Alternatively, an azeotrope-like composition may be characterized as a composition having a boiling point temperature of less than the boiling point of each pure component.

Further, yet another way to characterize an azeotrope-like composition is that the bubble point pressure of the composition and the dew point vapor pressure of the composition at a particular temperature are substantially the same. Near-azeotropic compositions exhibit dew point pressure and bubble point pressure with virtually no pressure differential. Hence, the difference in the dew point pressure and bubble point pressure at a given temperature will be a small value. It may be stated that compositions with a difference in dew point pressure and bubble point pressure of less than or equal to 3 percent (based upon the bubble point pressure) may be considered to be a near-azeotropic.

MPHE comprises isomeric mixtures of unsaturated fluoroethers which are the products of the reaction of perfluoroheptenes such as perfluoro-3-heptene with methanol in the presence of a strong base. In one embodiment, the mixture comprises a mixture of one or more of the following compounds: $CF_3CF_2CF=CFCF(OR)CF_2CF_3$, $CF_3CF_2C(OR)=CFCF_2CF_2CF_3$, $CF_3CF=CFCF(OR)CF_2CF_2CF_3$, and $CF_3CF_2CF=C(OR)CF_2CF_2CF_3$; wherein $R=CH_3$.

Compositions comprising MPHE and trans dichloroethylene containing 13.5 weight percent MPHE are useful in cleaning applications. However, the intermittent observation of flash points when conducting multiple tests for flash point according to ASTM test methods causes the present inventors to search for other nonflammable compositions.

The present inventors have discovered that addition of small amounts of 1,1,1,2,3,4,4,5,5,5-decafluoropentane (HFC-43-10mee) to binary compositions of MPHE and trans-dichloroethylene results in compositions that exhibit constant boiling characteristics, and have reduced flammability. Addition of 0.6 weight percent or more of (HFC-43-10mee) results in compositions which do not exhibit a measurable flash point in closed cup flash point testing.

In one embodiment of the invention, the compositions comprise from about 90 to 99 weight percent trans-1,2-dichloroethylene, from 0.1 to 8 weight percent MPHE and from 0.1 to 2 weight percent HFC-4310mee. In another embodiment of the invention, the compositions comprise from about 93 to 97 weight percent trans-1,2-dichloroethylene, from 3 to 6 weight percent MPHE and from 0.1 to 2 weight percent HFC-4310mee. In yet another embodiment of the invention, the compositions comprise 95 weight percent trans-1,2-dichloroethylene, from 4.0 to 4.4 weight percent MPHE and from 0.6 to 1.0 weight percent HFC-4310mee.

In one embodiment of the invention, the compositions consist essentially of from about 90 to 99 weight percent trans-1,2-dichloroethylene, from 0.1 to 8 weight percent MPHE and from 0.1 to 2 weight percent HFC-4310mee. In another embodiment of the invention, the compositions consist essentially of from about 93 to 97 weight percent trans-1,2-dichloroethylene, from 3 to 6 weight percent MPHE and from 0.1 to 2 weight percent HFC-4310mee. In yet another embodiment of the invention, the compositions consist essentially of 95 weight percent trans-1,2-dichloroethylene, from 4.0 to 4.4 weight percent MPHE and from 0.6 to 1.0 weight percent HFC-4310mee.

In one embodiment, the present compositions may further comprise a propellant. Aerosol propellant may assist in delivering the present composition from a storage container to a surface in the form of an aerosol. Aerosol propellant is optionally included in the present composition in up to about 25 weight percent of the total composition. Representative aerosol propellants comprise air, nitrogen, carbon dioxide, 2,3,3,3-tetrafluoropropene (HFO-1234yf), trans-1,3,3,3-tetrafluoropropene (HFO-1234ze), 1,2,3,3,3-pentafluoropropene (HFO-1225ye), difluoromethane ($CF_2H_2$, HFC-32), trifluoromethane ($CF_3H$, HFC-23), difluoroethane ($CHF_2CH_3$, HFC-152a), trifluoroethane ($CH_3CF_3$, HFC-143a; or $CHF_2CH_2F$, HFC-143), tetrafluoroethane ($CF_3CH_2F$, HFC-134a; or $CF_2HCF_2H$, HFC-134), pentafluoroethane ($CF_3CF_2H$, HFC-125), 1,1,1,2,3,3,3-heptafluoropropane (HFC-227ea), and hydrocarbons, such as propane, butanes, or pentanes, dimethyl ether, or combinations thereof.

In another embodiment, the present compositions may further comprise at least one surfactant. The surfactants of the present disclosure include all surfactants known in the art for dewatering or drying of substrates. Representative surfactants include alkyl phosphate amine salts (such as a 1:1 salt of 2-ethylhexyl amine and isooctyl phosphate); ethoxylated alcohols, mercaptans or alkylphenols; quaternary ammonium salts of alkyl phosphates (with fluoroalkyl groups on either the ammonium or phosphate groups); and mono- or di-alkyl phosphates of fluorinated amines. Additional fluorinated surfactant compounds are described in U.S. Pat. No. 5,908,822, incorporated herein by reference.

The amount of surfactant included in the dewatering compositions of the present invention can vary widely depending on the particular drying application in which the composition will be used, but is readily apparent to those skilled in the art. In one embodiment, the amount of surfactant dissolved in the unsaturated fluorinated ether solvent is not greater than about 1 weight percent, based on the total weight of the surfactant/solvent composition. In another embodiment, larger amounts of surfactant can be used, if after treatment with the composition, the substrate being dried is thereafter treated with solvent containing either no or minimal surfactant. In one embodiment, the amount of surfactant is at least about 50 parts per million (ppm, on a weight basis). In another embodiment, the amount of surfactant is from about 100 to about 5000 ppm. In yet another embodiment, the amount of surfactant used is from about 200 to about 2000 ppm based on the total weight of the dewatering composition.

Optionally, other additives may be included in the present compositions comprising solvents and surfactants for use in dewatering. Such additives include compounds having antistatic properties; the ability to dissipate static charge from non-conductive substrates such as glass and silica. Use of an antistatic additive in the dewatering compositions of the present invention may be necessary to prevent spots and stains when drying water or aqueous solutions from electrically non-conductive parts such as glass lenses and mirrors. Most unsaturated fluoroether solvents of the present invention also have utility as dielectric fluids, i.e., they are poor conductors of electric current and do not easily dissipate static charge.

Boiling and general circulation of dewatering compositions in conventional drying and cleaning equipment can create static charge, particularly in the latter stages of the drying process where most of the water has been removed from a substrate. Such static charge collects on non-conductive surfaces of the substrate and prevents the release of water from the surface. The residual water dries in place resulting in undesirable spots and stains on the substrate. Static charge remaining on substrates can bring out impurities from the cleaning process or can attract impurities such as lint from the air, which results in unacceptable cleaning performance.

In one embodiment, desirable antistatic additives are polar compounds, which are soluble in the present unsaturated fluorinated ether solvent and result in an increase in the conductivity of the unsaturated fluorinated ether solvent resulting in dissipation of static charge from a substrate. In another embodiment, the antistatic additives have a normal boiling point near that of the unsaturated fluorinated ether solvent and have minimal to no solubility in water. In yet another embodiment, the antistatic additives have a solubility in water of less than about 0.5 weight percent. In one embodiment, the solubility of antistatic agent is at least 0.5 weight percent in unsaturated fluorinated ether solvent. In one embodiment, the antistatic additive is nitromethane ($CH_3NO_2$).

In one embodiment, the dewatering composition containing an antistatic additive is effective in both the dewatering and drying and rinse steps of a method to dewater or dry a substrate as described below.

Another embodiment relates to a method for dewatering or drying a substrate comprising:
  a) contacting the substrate with a composition comprising 90 to 99 weight percent trans-1,2-dichloroethylene, from 0.1 to 8 weight percent methylperfluoroheptene ethers and from 0.1 to 2.0 weight percent of 1,1,1,2,2,3,4,5,5,5-decafluoropentane, further comprising a surfactant, thereby dewatering the substrate; and
  b) recovering the dewatered substrate from the composition.

In one embodiment, the surfactant for dewatering and drying is soluble to at least 1 weight percent based on the total solvent/surfactant composition weight. In another embodiment, the dewatering or drying method of the present disclosure is very effective in displacing water from a broad range of substrates including metals, such as tungsten, copper, gold, beryllium, stainless steel, aluminum alloys, brass and the like; from glasses and ceramic surfaces, such as glass, sapphire, borosilicate glass, alumina, silica such as silicon wafers used in electronic circuits, fired alumina and the like; and from plastics such as polyolefin ("Alathon", Rynite®, "Tenite"), polyvinylchloride, polystyrene (Styron), polytetrafluoroethylene (Teflon®), tetrafluoroethylene-ethylene copolymers (Tefzel®), polyvinylidenefluoride ("Kynar"), ionomers (Surlyn®), acrylonitrile-butadiene-styrene polymers (Kralac®), phenol-formaldehyde copolymers, cellulosic ("Ethocel"), epoxy resins, polyacetal (Delrin®), poly(p-phenylene oxide) (Noryl®), polyetherketone ("Ultrapek"), polyetheretherketone ("Victrex"), poly(butylene terephthalate) ("Valox"), polyarylate (Arylon®), liquid crystal polymer, polyimide (Vespel®), polyetherimides ("Ultem"), polyamideimides ("Torlon"), poly(p-phenylene sulfide) ("Rython"), polysulfone ("Udel"), and polyaryl sulfone ("Rydel"). In another embodiment, the compositions for use in the present dewatering or drying method are compatible with elastomers.

In one embodiment, the disclosure is directed to a process for removing at least a portion of water from the surface of a wetted substrate (dewatering), which comprises contacting the substrate with the aforementioned dewatering composition, and then removing the substrate from contact with the dewatering composition. In another embodiment, water originally bound to the surface of the substrate is displaced by solvent and/or surfactant and leaves with the dewatering composition. As used herein, the term "at least a portion of water" means at least about 75 weight percent of water at the surface of a substrate is removed per immersion cycle. As used herein, the term "immersion cycle" means one cycle involving at least a step wherein substrate is immersed in the present dewatering composition.

Optionally, minimal amounts of surfactant remaining adhered to the substrate can be further removed by contacting the substrate with surfactant-free halocarbon solvent. Holding the article in the solvent vapor or refluxing solvent will further decrease the presence of surfactant remaining on the substrate. Removal of solvent adhering to the surface of the substrate is effected by evaporation. Evaporation of solvent at atmospheric or subatmospheric pressures can be employed and temperatures above and below the boiling point of the halocarbon solvent can be used.

Methods of contacting the substrate with dewatering composition are not critical and can vary widely. For example, the substrate can be immersed in the composition, or the substrate can be sprayed with the composition using conventional equipment. Complete immersion of the substrate is preferred as it generally insures contact between the composition and all exposed surfaces of the substrate. However, any other method, which can easily provide such complete contact may be used.

The time period over which substrate and dewatering composition are contacted can vary widely. Usually, the contacting time is up to about 5 minutes, however, longer times may be used if desired. In one embodiment of the dewatering process, the contacting time is from about 1 second to about 5 minutes. In another embodiment, the contacting time of the dewatering process is from about 15 seconds to about 4 minutes.

Contacting temperatures can also vary widely depending on the boiling point of the composition. In general, the contacting temperature is equal to or less than the composition's normal boiling point.

In one embodiment, the compositions of the present disclosure may further contain a co-solvent. Such co-solvents are desirable where the present compositions are employed in cleaning conventional process residue from substrates, e.g., removing soldering fluxes and degreasing mechanical components comprising substrates of the present invention. Such co-solvents include alcohols (such as methanol, ethanol, isopropanol), ethers (such as diethyl ether, methyl tertiary-butyl ether), ketones (such as acetone), esters (such as ethyl acetate, methyl dodecanoate, isopropyl myristate and the dimethyl or diisobutyl esters of succinic, glutaric or adipic acids or mixtures thereof), ether alcohols (such as propylene glycol monopropyl ether, dipropylene glycol monobutyl ether, and tripropylene glycol monomethyl ether), and hydrocarbons (such as pentane, cyclopentane, hexane, cyclohexane, heptane, octane), and hydrochlorocarbons (such as trans-1,2-dichloroethylene). When such a co-solvent is employed with the present composition for substrate dewatering or cleaning, it may be present in an amount of from about 1 weight percent to about 50 weight percent based on the weight of the overall composition.

Another embodiment of the disclosure relates to a method of cleaning a surface comprising:
 a. contacting the surface with a composition comprising 90 to 99 weight percent trans-1,2-dichloroethylene, from 0.1 to 8 weight percent methylperfluoroheptene ethers and from 0.1 to 2.0 weight percent of 1,1,1,2,2,3,4,5,5,5-decafluoropentane, and
 b. recovering the surface from the composition.

In one embodiment, the compositions of the invention are useful as cleaning compositions, cleaning agents, deposition solvents and as dewatering or drying solvents. In another embodiment, the invention relates to a process for removing residue from a surface or substrate comprising contacting the surface or substrate with a cleaning composition or cleaning agent of the present disclosure and, optionally, recovering the surface or substrate substantially free of residue from the cleaning composition or cleaning agent.

In yet another embodiment, the present disclosure relates to a method for cleaning surfaces by removing contaminants from the surface. The method for removing contaminants from a surface comprises contacting the surface having contaminants with a cleaning composition of the present invention to solubilize the contaminants and, optionally, recovering the surface from the cleaning composition. The surface is then substantially free of contaminants. As stated previously, the contaminants or residues that may be removed by the present method include, but are not limited to oils and greases, flux residues, and particulate contaminants.

In one embodiment of the present disclosure, the method of contacting may be accomplished by spraying, flushing, wiping with a substrate e.g., wiping cloth or paper, that has the cleaning composition incorporated in or on it. In another embodiment of the present disclosure, the method of contacting may be accomplished by dipping or immersing the article in a bath of the cleaning composition.

In one embodiment of the present disclosure, the process of recovering is accomplished by removing the surface that has been contacted from the cleaning composition bath. In another embodiment of the invention, the process of recovering is accomplished by allowing the cleaning composition that has been sprayed, flushed, or wiped on the disk to drain away. Additionally, any residual cleaning composition that may be left behind after the completion of the previous steps may be evaporated in a manner similar to that for the deposition method.

The method for cleaning a surface may be applied to the same types of surfaces as the method for deposition as described below. Semiconductor surfaces or magnetic media disks of silica, glass, metal or metal oxide, or carbon may have contaminants removed by the process of the invention. In the method described above, contaminant may be removed from a disk by contacting the disk with the cleaning composition and recovering the disk from the cleaning composition.

In yet another embodiment, the present method also provides methods of removing contaminants from a product, part, component, substrate, or any other article or portion thereof by contacting the article with a cleaning composition of the present disclosure. As referred to herein, the term "article" refers to all such products, parts, components, substrates, and the like and is further intended to refer to any surface or portion thereof.

As used herein, the term "contaminant" is intended to refer to any unwanted material or substance present on the article, even if such substance is placed on the article intentionally. For example, in the manufacture of semiconductor devices it is common to deposit a photoresist material onto a substrate to form a mask for the etching operation and to subsequently remove the photoresist material from the substrate. The term "contaminant," as used herein, is intended to cover and encompass such a photo resist material. Hydrocarbon based oils and greases and dioctylphthalate are examples of the contaminants that may be found on the carbon coated disks.

In one embodiment, the method of the invention comprises contacting the article with a cleaning composition of the invention, in a vapor degreasing and solvent cleaning method. In one such embodiment, vapor degreasing and solvent cleaning methods consist of exposing an article, preferably at room temperature, to the vapors of a boiling cleaning composition. Vapors condensing on the object have the advantage of providing a relatively clean, distilled cleaning composition to wash away grease or other contamination. Such processes thus have an additional advantage in that final evaporation of the present cleaning composition from the object leaves behind relatively little residue as compared to the case where the object is simply washed in liquid cleaning composition.

In another embodiment, for applications in which the article includes contaminants that are difficult to remove, the method of the invention involves raising the temperature of the cleaning composition above ambient temperature or to any other temperature that is effective in such application to substantially improve the cleaning action of the cleaning composition. In one such embodiment, such processes are also generally used for large volume assembly line operations where the cleaning of the article, particularly metal parts and assemblies, must be done efficiently and quickly.

In one embodiment, the cleaning methods of the present disclosure comprise immersing the article to be cleaned in liquid cleaning composition at an elevated temperature. In another embodiment, the cleaning methods of the present disclosure comprise immersing the article to be cleaned in liquid cleaning composition at about the boiling point of the cleaning composition. In one such embodiment, this step removes a substantial amount of the target contaminant from the article. In yet another embodiment, this step removes a major portion of the target contaminant from the article. In one embodiment, this step is then followed by immersing the article in freshly distilled cleaning composition, which is at a temperature below the temperature of the liquid cleaning composition in the preceding immersion step. In one such embodiment, the freshly distilled cleaning composition is at about ambient or room temperature. In yet another embodiment, the method also includes the step of then contacting the article with relatively hot vapor of the cleaning composition by exposing the article to vapors rising from the hot/boiling cleaning composition associated with the first mentioned immersion step. In one such embodiment, this results in condensation of the cleaning composition vapor on the article. In certain preferred embodiments, the article may be sprayed with distilled cleaning composition before final rinsing.

It is contemplated that numerous varieties and types of vapor degreasing equipment are adaptable for use in connection with the present methods. One example of such equipment and its operation is disclosed by U.S. Pat. No. 3,085,918, which is incorporated herein by reference. The equipment disclosed therein includes a boiling sump for containing a cleaning composition, a clean sump for containing distilled cleaning composition, a water separator, and other ancillary equipment.

The present cleaning methods may also comprise cold cleaning in which the contaminated article is either immersed in the fluid cleaning composition of the present disclosure under ambient or room temperature conditions or wiped under such conditions with rags or similar objects soaked in the cleaning composition.

The concepts described herein will be further described in the following examples, which do not limit the scope of the invention described in the claims. Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification is to be regarded in an illustrative, rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

EXAMPLES

Example 1

Flammability of Compositions of MPHE, HFC-4310mee and t-DCE

The flash point of compositions of MPHE, HFC-4310mee and t-DCE was determined in accordance with ASTM D56-05(2010) Standard Test Method for Flash Point by Tag Closed Cup Tester. Results are shown in Table 1.

TABLE 1

| t-DCE | MPHE | HFC-4310mee | Tag Closed Cup Flash Point |
|---|---|---|---|
| 98 | 2.0 | 0 | −10 |
| 97 | 3.0 | 0 | −10 |
| 96 | 4.0 | 0 | −10 |
| 95.5 | 4 | 0.5 | −5 |
| 95.4 | 4 | 0.6 | none |
| 95.3 | 4 | 0.7 | none |
| 95.2 | 4 | 0.8 | none |
| 95.1 | 4 | 0.9 | none |
| 95.0 | 4 | 1.0 | none |

The above data shows that mixtures containing 0.6 or more wt % HFC-43-10mee are surprisingly nonflammable in the Tag Closed cup test.

Example 2

KB Value of Blends

The Kauri-Butanol value for a mixture of 4.0% MPHE, 0.6% HFC-4310MEE and 95.4% t-DCE was determined according to ASTM D1133-Standard Test Method for Kauri- Butanol Value of Hydrocarbon Solvents. The KB value was determined to be 100, demonstrating the high solvency power of the mixture.

Example 3

Azeotrope-Like Behavior of MPHE, HFC-4310mee, t-DCE Blends

The ternary mixtures shown in Table 2 were prepared and the boiling point of the mixtures measured in an ebulliometer. As seen in Table 2, mixtures containing 95 wt % t-DCE and HFC-4310mee and MPHE in ranges from 0 to 1.8% and 5.0 to 3.2%, respectively, exhibit azeotrope-like behavior, i.e., over this compositional range the boiling point is essentially constant, differing only by 1° C. (from 47.1 to 48.1° C.) over the entire compositional range.

TABLE 2

MPHE/HFC-4310mee/t-DCE Mixtures

| | t-DCE wt % | MPHE wt % | HFC-4310mee wt % | Boiling point ° C. |
|---|---|---|---|---|
| 1 | 95.0 | 5.0 | 0.0 | 48.1 |
| 2 | 95.0 | 4.8 | 0.2 | 47.9 |
| 3 | 95.0 | 4.6 | 0.4 | 47.5 |
| 4 | 95.0 | 4.4 | 0.6 | 47.6 |
| 5 | 95.0 | 4.2 | 0.8 | 47.2 |
| 6 | 95.0 | 4.0 | 1.0 | 47.3 |
| 7 | 95.0 | 3.8 | 1.2 | 47.5 |
| 8 | 95.0 | 3.6 | 1.4 | 47.3 |
| 9 | 95.0 | 3.4 | 1.6 | 47.4 |
| 10 | 95.0 | 3.2 | 1.8 | 47.1 |
| 11 | 95.0 | 3.0 | 2.0 | 46.8 |
| 12 | 95.0 | 2.8 | 2.2 | 46.6 |
| 13 | 95.0 | 2.6 | 2.4 | 46.4 |
| 14 | 95.0 | 2.4 | 2.6 | 46.3 |

Example 4

Cleaning Performance of Compositions of MPHE, HFC-4310mee and t-DCE

As shown in example 2, the KB value is a measure of solvency power of the blends. In Table 3 below, examples of cleaning performance of a composition of 5% by weight MPHE, 94% by weight trans-dichloroethylene and 1% by weight MFC-43-10mee in a vapor degreaser is demonstrated for a variety of soils used in different industries.

TABLE 3

| composition | Soils | Cleaning Performance |
|---|---|---|
| MPHE/HFC-4310/T-DCE | MIL-PRF-83282 Synthetic HC hydraulic fluid | 99 (% soil removed) |
| MPHE/HFC-4310/T-DCE | MIL-PRF-81322 General propose grease | 99 (% soil removed) |
| MPHE/HFC-4310/T-DCE | Mineral Oil | 97 (% soil removed) |
| MPHE/HFC-4310/T-DCE | Synthetic Oil | 95 (% soil removed) |

Example 5

Distillation of MPHE, HFC-4310mee and t-DCE Composition

Table 4 below demonstrates that after distillation of a mixture containing 95.16% t-DCE, 3.98% MPHE and 0.86% HFC-4310mee, the distillate composition is identical in composition to the original mixture.

TABLE 4

| | Component Concentrations, % w/w | | | | | |
|---|---|---|---|---|---|---|
| | Pot XF | Distillate XF | Pot t-DCE | Distillate t-DCE | Pot MPHE | Distillate MPHE |
| Original Batch | 0.86 | | 95.16 | | 3.98 | |
| 90% Distilled | 0 | 0.7 | 95.55 | 95.34 | 4.44 | 3.96 |

What is claimed is:

1. A composition comprising 90 to 99 weight percent trans-1,2-dichloroethylene, from 0.1 to 8 weight percent methylperfluoroheptene ethers and from 0.1 to 2.0 weight percent of 1,1,1,2,2,3,4,5,5,5-decafluoropentane, wherein the composition is non-flammable.

2. The composition of claim 1, comprising 93 to 97 weight percent trans-1,2-dichloroethylene, from 3 to 6 weight percent methylperfluoroheptene ethers and from 0.1 to 2.0 weight percent 1,1,1,2,2,3,4,5,5,5-decafluoropentane.

3. The composition of claim 1, comprising 95 weight percent trans-1,2-dichloroethylene, from 4.0 to 4.4 weight percent methylperfluoroheptene ethers and from 0.6 to 1.0 weight percent 1,1,1,2,2,3,4,5,5,5-decafluoropentane.

4. A composition consisting essentially of 90 to 99 weight percent trans-1,2-dichloroethylene, from 0.1 to 8 weight percent methylperfluoroheptene ethers and from 0.1 to 2.0 weight percent of 1,1,1,2,2,3,4,5,5,5-decafluoropentane, wherein the composition is non-flammable.

5. The composition of claim 4, consisting essentially of 93 to 97 weight percent trans-1,2-dichloroethylene, from 3 to 6 weight percent methylperfluoroheptene ethers and from 0.1 to 2.0 weight percent 1,1,1,2,2,3,4,5,5,5-decafluoropentane.

6. The composition of claim 4, consisting essentially of 95 weight percent trans-1,2-dichloroethylene, from 4.0 to 4.4 weight percent methylperfluoroheptene ethers and from 0.6 to 1.0 weight percent 1,1,1,2,2,3,4,5,5,5-decafluoropentane.

7. A method for removing residue from a surface of an article comprising:
   a. contacting said surface with a composition comprising 90 to 99 weight percent trans-1,2-dichloroethylene, from 0.1 to 8 weight percent methylperfluoroheptene ethers and from 0.1 to 2.0 weight percent of 1,1,1,2,2,3,4,5,5,5-decafluoropentane; and
   b. recovering said surface from the composition.

8. The method of claim 7, wherein said composition further comprises a propellant.

9. The method of claim 8, wherein said propellant is comprised of air, nitrogen, carbon dioxide, 2,3,3,3-tetrafluoropropene, trans-1,3,3,3-tetrafluoropropene, 1,2,3,3,3-pentafluoropropene, difluoromethane, trifluoromethane, difluoroethane, trifluoroethane, tetrafluoroethane, pentafluoroethane, hydrocarbons, or dimethyl ether, or combinations thereof.

10. The method of claim 7, wherein said composition further comprises at least one surfactant.

11. The method of claim 7, wherein said contacting is accomplished by vapor degreasing.

12. The method of claim 11, wherein said vapor degreasing is performed by:
   a. boiling the composition; and
   b. exposing the article to vapors of said composition.

13. The method of claim 7, wherein said contacting is accomplished by a first step of immersing the article in said composition, wherein the composition is at a temperature greater than ambient temperature or room temperature.

14. The method of claim 13, wherein the composition is at a temperature of about the boiling point of the composition.

15. The method of claim 13, further comprising a second step of immersing the article in said composition, wherein said composition is at a temperature lower than the temperature of the first immersing step.

16. The method of claim 15, wherein the composition in the second immersing step is at ambient temperature or room temperature.

17. The method of claim 15, further comprising the steps of boiling the composition and exposing the article to vapors of the boiling composition.

18. The method of claim 7, wherein the composition is at ambient temperature or room temperature.

19. The method of claim 7, wherein said contacting is accomplished by wiping the surface with an object saturated with the composition.

\* \* \* \* \*